United States Patent [19]

Natsume

[11] Patent Number: 5,672,520
[45] Date of Patent: Sep. 30, 1997

[54] METHOD OF CHECKING ALIGNMENT ACCURACY IN PHOTOLITHOGRAPHY

[75] Inventor: Hidetaka Natsume, Tokyo, Japan

[73] Assignee: NEC Corporation, Tokyo, Japan

[21] Appl. No.: 620,808

[22] Filed: Mar. 28, 1996

[30] Foreign Application Priority Data

Mar. 30, 1995 [JP] Japan ................................ 7-072810

[51] Int. Cl.$^6$ ................................................ H01L 21/66
[52] U.S. Cl. ............................ 437/8; 437/229; 437/924
[58] Field of Search ................................ 437/7, 8, 229, 437/924; 148/DIG. 102, DIG. 162

[56] References Cited

U.S. PATENT DOCUMENTS

| 5,376,589 | 12/1994 | Thienel ................................ 437/8 |
| 5,405,810 | 4/1995 | Mizuno et al. ..................... 437/229 |
| 5,407,763 | 4/1995 | Pai ..................................... 437/924 |
| 5,545,593 | 8/1996 | Watkins et al. ................... 437/924 |

FOREIGN PATENT DOCUMENTS 2-197113  8/1990  Japan .

*Primary Examiner*—Chandra Chaudhari
*Attorney, Agent, or Firm*—Whitham, Curtis, Whitham & McGinn

[57] ABSTRACT

In a photolithographic step in the fabrication of semiconductor integrated circuits, alignment of the photomask pattern with two patterns defined on the wafer in two previous steps is checked simultaneously. Each of the two patterns on the wafer is provided with an alignment check pattern consisting of a plurality of rectangular pattern elements arranged parallel to each other in a row at a first constant pitch. The pattern elements of one check pattern are respectively opposite to the pattern elements of the other check pattern. On the photomask there is an alignment check pattern consisting of a plurality of rectangular and relatively long pattern elements arranged parallel to each other in a row at a second constant pitch. In the composite layout of the three alignment check patterns, each pattern element of the check pattern on the photomask partly ovelaps a pattern element of each of the two check patterns on the wafer. Alignment accuracy is checked by examining which pattern element of the check pattern on the photomask is in accurate alignment with a pattern element of each check pattern on the wafer. Alignment of the photomask pattern with more than two patterns on the wafer can be checked in the same manner.

6 Claims, 4 Drawing Sheets

METHOD OF CHECKING ALIGNMENT ACCURACY IN PHOTOLITHOGRAPHY

BACKGROUND OF THE INVENTION

This invention relates generally to the fabrication of semiconductor integrated circuits, and more particularly to a method of checking alignment accuracy in a photolithographic step.

In fabricating semiconductor integrated circuits on a wafer it is necessary to repeat photolithography operations many times using different photomasks. In each photolithography operation the photomask pattern must be aligned with a pattern already defined on the wafer by a previous photolithography operation.

The importance of alignment accuracy augments as the scale of integration of circuit components becomes larger and the circuit features becomes finer. To check alignment accuracy, it is usual to use a combination of an alignment mark on the photomaske and a corresponding alignment mark formed on the wafer together with a previously defined pattern. It is difficult to detect small alignment errors by using alignment marks of simple shape such as concentrically circular marks or symmetrically polygonal marks.

JP-A 197113 proposes a combination of two alignment check patterns for easy and accurate detection of misalignment. According to the proposal, a pattern previously defined on the wafer includes an alignment check pattern consisting of a plurality of rectangular pattern elements arranged parallel to each other in a row at a constant pitch (hereinafter, the first pitch). On the photomask for the next photolithographic operation there is an alignment check pattern consisting of a plurality of rectangular pattern elements arranged parallel to each other in a row at a second constant pitch slightly smaller than the first pitch. When the two alignment check patterns are superposed, the rows of pattern elements of the two check patterns are parallel to each other, and the pattern elements of the check pattern on the photomask partly overlap the pattern elements of the check pattern on the wafer, respectively. Alignment is checked by examining which of the pattern elements of the check pattern on the photomask is in accurate alignment with a pattern element of the check pattern on the wafer. When the center element of the check pattern on the photomask is in accurate alignment with the center element of the check pattern on the wafer, alignment of the photomask pattern is perfect (in the direction along the rows of pattern elements of the check patterns). The combination of the two alignment check patterns utilizes the principle of a vernier scale.

Meanwhile, in some cases a photomask pattern must be aligned with two (or more than two) patterns defined on the wafer by two previous photolithographic steps. For example, in forming a shared contact in the fabrication of SRAMs, the contact must be accurately aligned with a diffused region and a subsequently patterned conducting layer. To check alignment of a photomask pattern with two patterns separately defined on the wafer by using known alignment marks including the alignment check patterns of JP-A 197113, the photomask needs to have two separately located alignment check marks or patterns, and the checking operation becomes a two-step operation entailing the movement of the checking apparatus between the locations of the two check marks or patterns. Naturally a greater burden is imposed on the operator, and the throughput of the photolithographic apparatus decreases. Besides, the provision of two alignment check patterns on the photomask results in an increase in an area of the wafer surface occupied by the transferred alignment check patterns.

SUMMARY OF THE INVENTION

The present invention relates to photolithography in the fabrication of semiconductor integrated circuts, and it is an object of the invention to provide a method for efficiently and accurately checking alignment of a photomask pattern with two or more than two patterns which are individually defined on the wafer by previous photolithographic steps.

A method according to the invention comprises (a) providing each of at least two patterns defined on the wafer with an alignment check pattern consisting of a plurality of pattern elements arranged in a row at a first constant pitch such that the rows of pattern elements of the respective alignment check patterns become parallel to each other and such that each pattern element of each alignment check pattern is in alignment with a pattern element of each of the other alignment check pattern(s), (b) providing the photomask pattern with another alignment check pattern consisting of a plurality of pattern elements arranged in a row at a second constant pitch different from the first constant pitch, the alignment check pattern on the photomask being arranged such that, in the composite layout of the alignment check patterns on the wafer and the alignment check pattern on the photomask, each pattern element of the alignment check pattern on the photomask partly overlaps a pattern element of each of the alignment check patterns on the wafer, and (c) examining which of the pattern elements of the alignment check on the photomask is in accurate alignment with a pattern element of each alignment check pattern on the wafer.

In preferred embodiments of the invention the pattern elements of every alignment check pattern are rectangular elements arranged such that the longitudinal axes thereof are parallel to each other, and in the composite layout the longitudinal axes of the rectangular pattern elements of the alignment check pattern on the photomask become parallel to the longitudinal axes of the rectangular pattern elements of the alignment check patterns on the wafer.

By using the present invention, alignment of a photomask pattern with a plurality of patterns previously defined on the wafer can be checked by a single-step operation without moving the alignment checking apparatus. So, the throughput of the photolithographic apparatus increases. In this invention an alignment check pattern on the photomask is used for checking alignment with a plurality of patterns on the wafer, and the alignment check patterns on the wafer can be located close to each other or partly overlapped. Therefore, on the wafer surface the alignment check patterns occupy a relatively small area.

DESCRIPTION OF THE PREFERRED EMBODIMENTS

Figure 1:
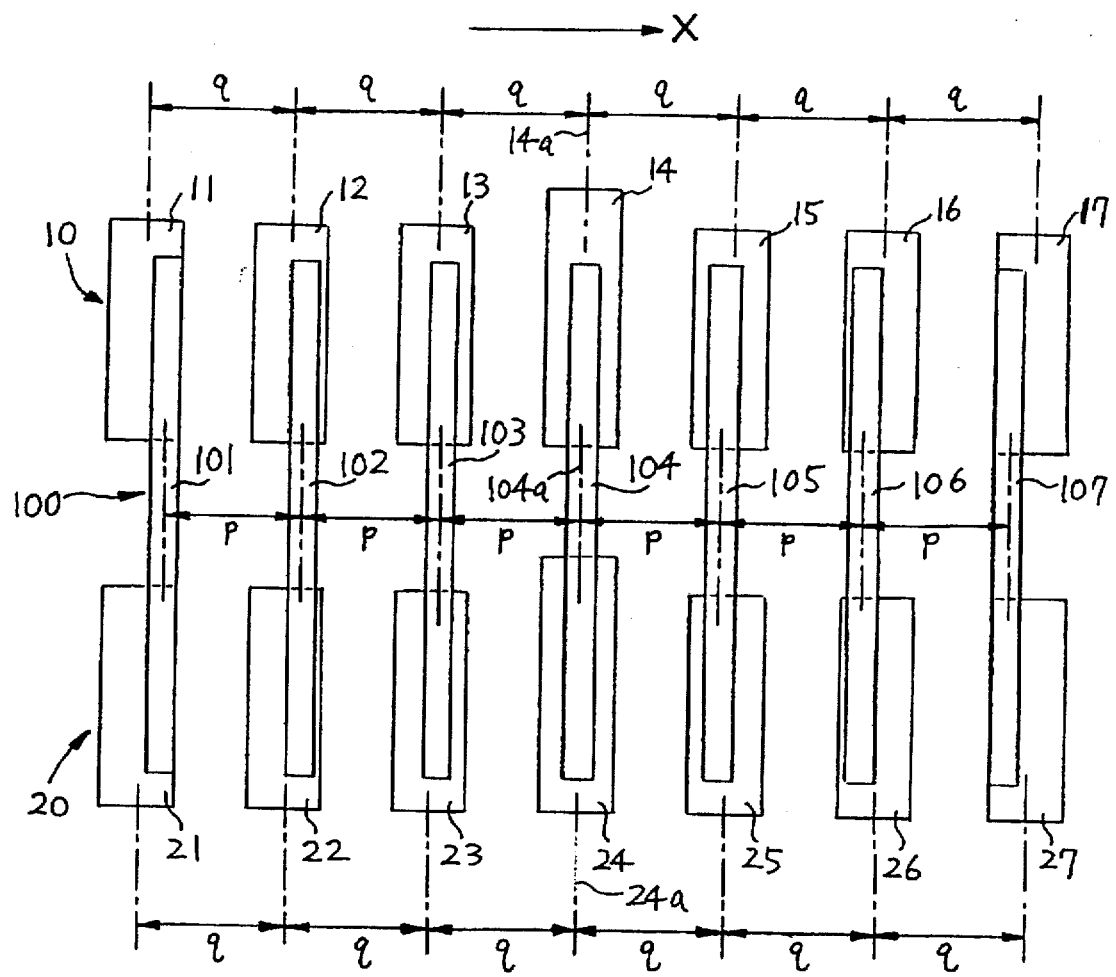
FIG. 1 shows the composite layout of a set of alignment check patterns according to the invention.

FIG. 1 shows a combination of three alignment check patterns 10, 20 and 100 according to the invention. The first alignment check pattern 10 consists of seven rectangular pattern elements 11, 12, . . . 17 which are arranged parallel to each other in a row at a constant pitch q. The three pattern elements 11, 12, 13 on the lefthand side and the three pattern elements 15, 16, 17 on the righthand side are symmetrical with respect to the element 14 in the center. The center element 14 is made longer than the other elements. This is favorable for the inspection of alignment accuracy, but this is not a requisite. This alignment check pattern 10 represents the location of a pattern of circuit components defined on a wafer in a previous photolithographic step. The second alignment check pattern 20 also consists of seven rectangular pattern elements 21, 22, . . . 27 which are arranged parallel to each other in a row at the constant pitch q. The three pattern elements 21, 22, 23 and the three pattern elements 25, 26, 27 are symmetrical with respect to the element 24 in the center. This alignment check pattern 20 represents the location of another pattern of circuit components defined on the wafer in another previous photolithographic step. The row of the pattern elements 21–27 of the second pattern 20 is parallel to and slightly spaced from the first pattern 10 and is arranged such that the seven rectangular elements 21–27 are longitudinally in alignment with the seven rectangular elements 11–17 of the first pattern 10, respectively.

The third alignment check pattern 100 exists on a photomask used in the next photolithographic step. In this step the photomask pattern (of circuit components) needs to be aligned with both of the two patterns defined on the wafer in the previous steps and provided with the first and second alignment check patterns 10 and 20, respectively. The alignment check pattern 100 consists of seven rectangular pattern elements 101, 102, . . . 107 which are arranged parallel to each other in a row at a constant pitch p. The three pattern elements 101, 102, 103 on the lefthand side and the three elements 105, 106, 107 on the righthand side are symmetrical with respect to the element 104 in the center. As shown in FIG. 1, it is preferable that the rectangular elements 101–107 of the third alignment check pattern 100 are narrower in width than the rectangular elements 11–17, 21–27 of the alignment check patterns 10, 20 on the wafer. The pitch p differs from the pitch q of the pattern elements of the alignment check patterns 10, 20, and in this example p is smaller than q. It is assumed that q−p=t. For example, in FIG. 1, p=0.95q.

For convenience, the third alignment check pattern 100 will be referred to as the overlying check pattern and the first and second alignment check patterns 10, 20 as the underlying check patterns.

In the composite (superposed) layout, the longitudinal axes of the rectangular elements 101–107 of the overlying check pattern 100 are parallel to the longitudinal axes of the elements 11–17, 21–27 of the underlying check patterns 10, 20, and each of the pattern elements 101–107 of the overlying pattern 100 partly overlaps both a pattern element (e.g. 11) of the underlying first pattern 10 and the oppositely positioned element (e.g. 21) Of the second pattern 20. For the ease of detection of alignment errors, it is favorable to make the overlapping areas as large as possible. The three alignment check patterns 10, 20, 100 are made such that, when perfect alignment in the direction X is achieved, the longitudinal center axis 104a of the center element 104 of the overlying check pattern 100 comes on the longitudinal center axis 14a of the center element 14 of the underylying check pattern 10 and the longitudinal center axis 24a of the center element 24 of the underlying check pattern 20.

Figure 2A:
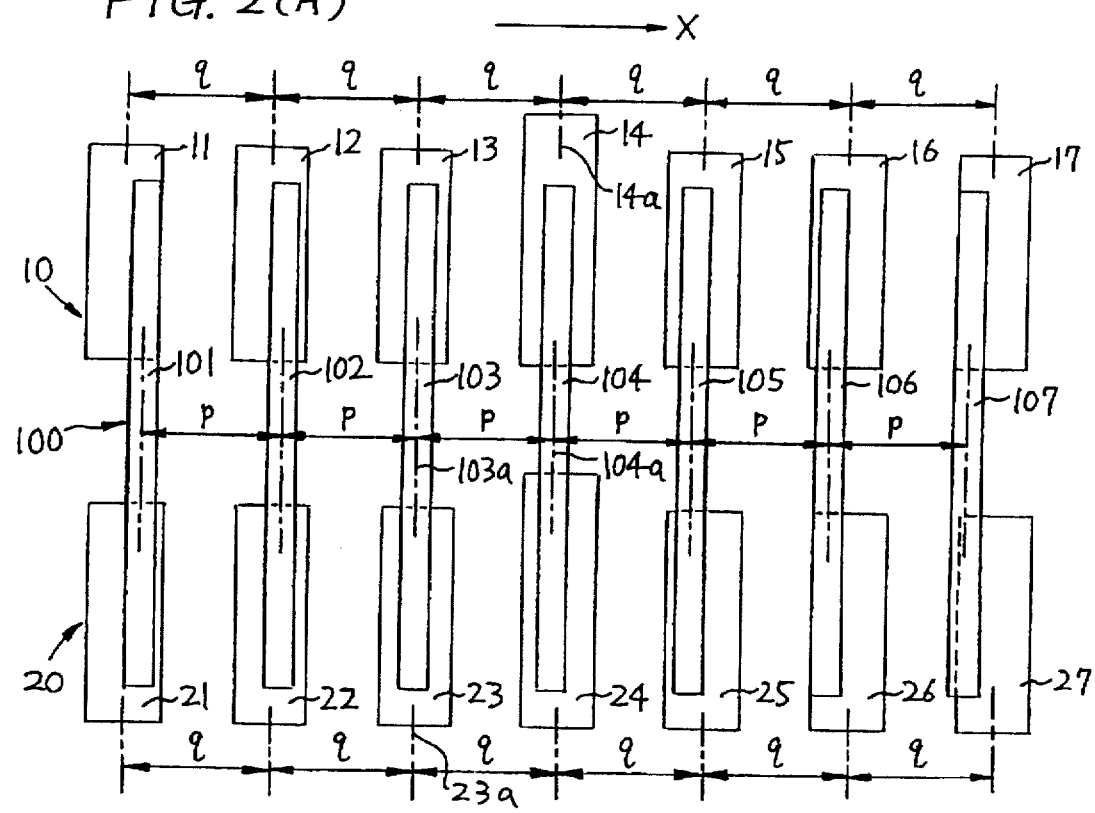
FIGS. 2(A) and 2(B) illustrate the detection of alignment errors by using the alignment check patterns of FIG. 1.
Figure 2B:
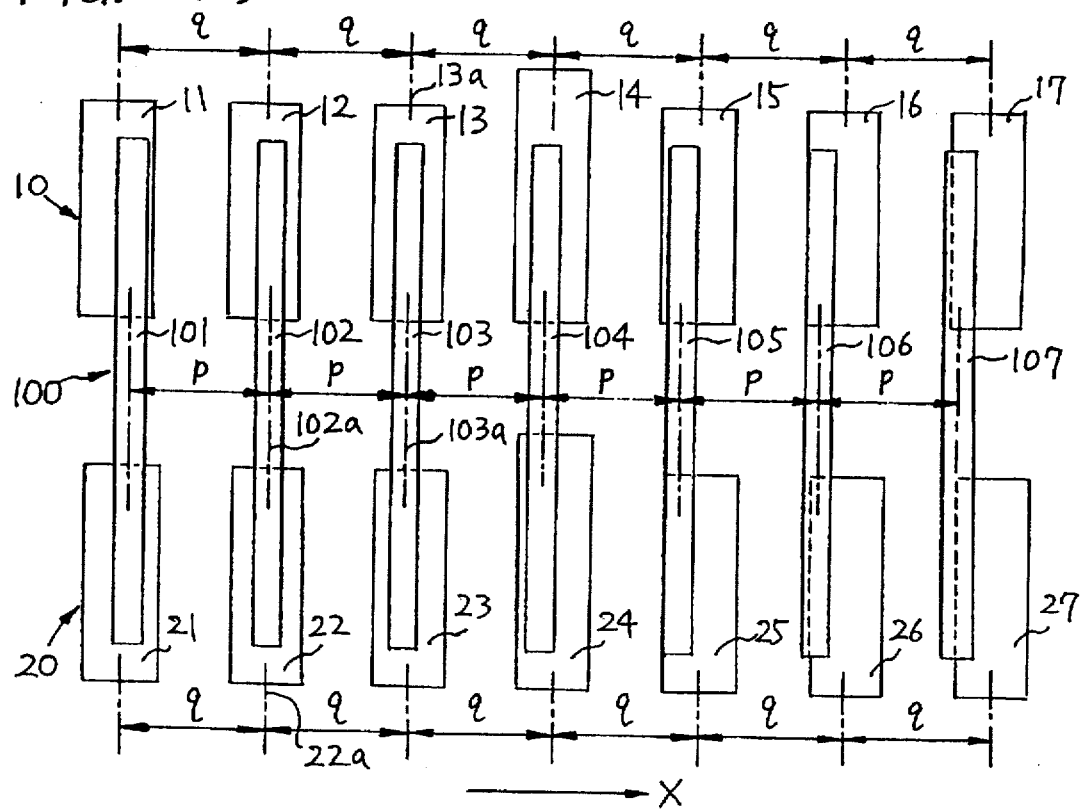

FIGS. 2(A) and 2(B) illustrate the detection of alignment errors by the alignment check patterns 10, 20, 100 of FIG. 1. In FIG. 2(A) the center axis 104a of the center element 104 of the overlying check pattern 100 is on the center axis 14a of the center element 14 of the underlying first check pattern 10 but is not on the center axis 24a of the center element 24 of the second check pattern 20. Instead, the center axis 103a of the next element 103 of the overlying check pattern 100 is on the center axis 23a of the element 23 of the second check pattern 20. In this case, the photomask pattern is accurately aligned (in the direction X) with the pattern defined on the wafer and provided with the check pattern 10, but with respect to the pattern previously defined on the wafer and provided with the check pattern 20 there is an alignment error in the direction X. The amount of the alignment error is t (=q−p). This alignment error is attributed to unperfect alignment of the pattern including the check pattern 20 with the pattern including the check pattern 10.

In FIG. 2(B) the longitudinal center axis 103a of the element 103 of the overlying check pattern 100 is on the center axis 13a of the element 13 of the underlying check pattern 10, and the center axis 102a of the element 102 of the pattern 100 is on the center axis 22a of the element 22 of the underlying check pattern 20. In this case, the photomask pattern is misaligned with the pattern including the check pattern 10 in the direction X by a distance t and is further misaligned with the pattern including the check pattern 20 in the direction of X by a distance 2t.

Thus, with respect to both of the two patterns defined on the wafer in previous photolithographic steps, alignment accuracy of the photomask pattern for the next photolithographic step can be checked by a single checking operation by using only one alignment check pattern on the photomask. Of course the alignment check pattern on the photomask is transferred onto the wafer together with the photomask pattern of circuit components.

In this invention the pattern elements (11–17, 21–27, 101–107) of the underlying and overlying check patterns 10, 20, 100 do not need to be exactly rectangular. For example, each pattern element may have tongue-like projections or a rectangular cut. It will be readily understood that the number of rectangular elements of each alignment check pattern is not limited to 7.

In the above described example the pitch p of the pattern elements of the overlying check pattern 10 is smaller than the pitch q of the pattern elements of the underlying check patterns 10, 20, but it is also possible to make the pitch p greater than the pitch q.

Usually the underlying first and second check patterns 10 and 20 are spaced from each other. However, for the purpose of decreasing the areas occupied by these check patterns it is permissible that the pattern elements 21–27 of the second check pattern 20 partly overlap the pattern elements 11–17 of the first check pattern 10.

Figure 4:
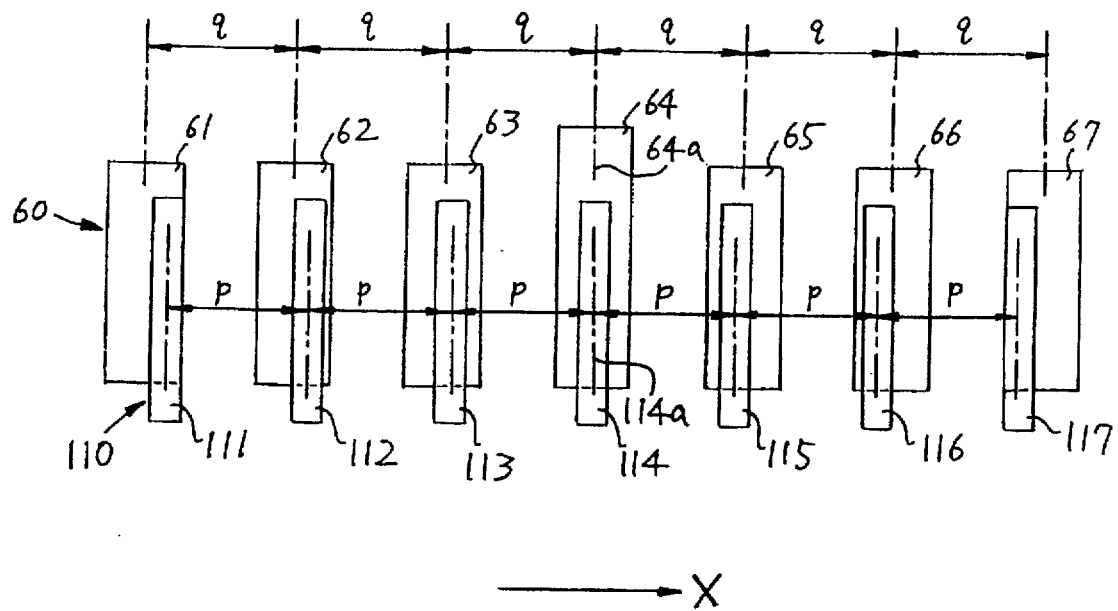
FIG. 4 shows the composite layout of a set of known alignment check patterns.
Figure 4:
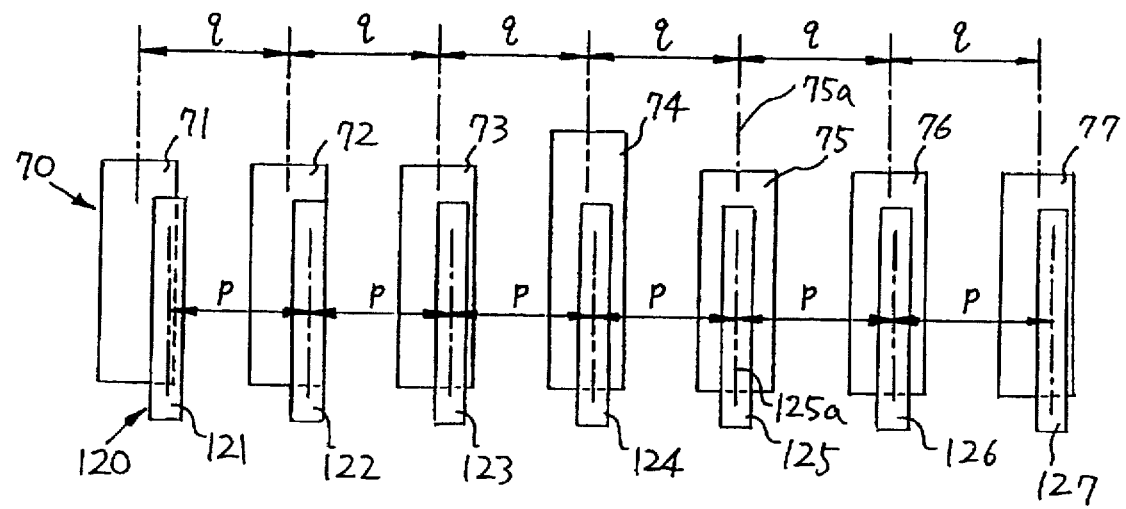

For comparison, FIG. 4 shows a combination of alignment check patterns according to JP-A 2-197113 for checking alignment of a photomask pattern with two patterns on the wafer. One of the two patterns on the wafer is provided with an alignment check pattern 60 consisting of seven rectangular pattern elements 61–67 which are arranged parallel to each other in a row at a constant pitch q. The other pattern on the wafer is provided with another alignment check pattern 70 consisting of seven rectangular pattern elements 71–77 arranged in a row at the constant pitch q. This alignment check pattern 70 is substantially similar to the check pattern 60 but is independent and separate from the check pattern 60.

On the photomask for the next step, there is an alignment check pattern 110 consisting of seven rectangular pattern elements 111–117 arranged in a row at a constant pitch p smaller than the pitch q for the purpose of checking alignment of the photomask pattern with the pattern on the wafer provided with the check pattern 60. In the composite layout each pattern element (e.g. 111) of the overlying check pattern 110 partly overlaps a pattern element (e.g. 61) of the underlying check pattern 60. The photomask has another alignment check pattern 120 which consists of seven rectangular pattern elements 121–127 arranged in a row at the constant pitch p. This check pattern 120 is substantially similar to the check pattern 110 and is arranged such that each element (e.g. 121) of this pattern 120 partly overlaps a pattern element (e.g. 71) of the underlying check pattern 70.

Alignment of the photomask pattern with the first pattern on the wafer is checked by using the combination of the underlying check pattern 80 and the overlying check pattern 110. (FIG. 4 illustrates accurate alignment in the direction X.) Next, alignment of the photomask pattern with the second pattern on the wafer is checked by using the combination of the underlying check pattern 70 and the overlying check pattern 120. FIG. 4 illustrates misalignment in the direction X by the distance (q–p). Thus, the check of alignment accuracy becomes a two-step operation, and there is the need of moving the checking apparatus from the location of the check patterns 80 and 110 to the location of the check patterns 70 and 120.

As mentioned hereinbefore, the invention can be used to check alignment of a photomask pattern with more than two patterns on the wafer by a single-step operation. For example, FIG. 3 shows an example of alignment check pattern layouts in such cases.

Figure 3:
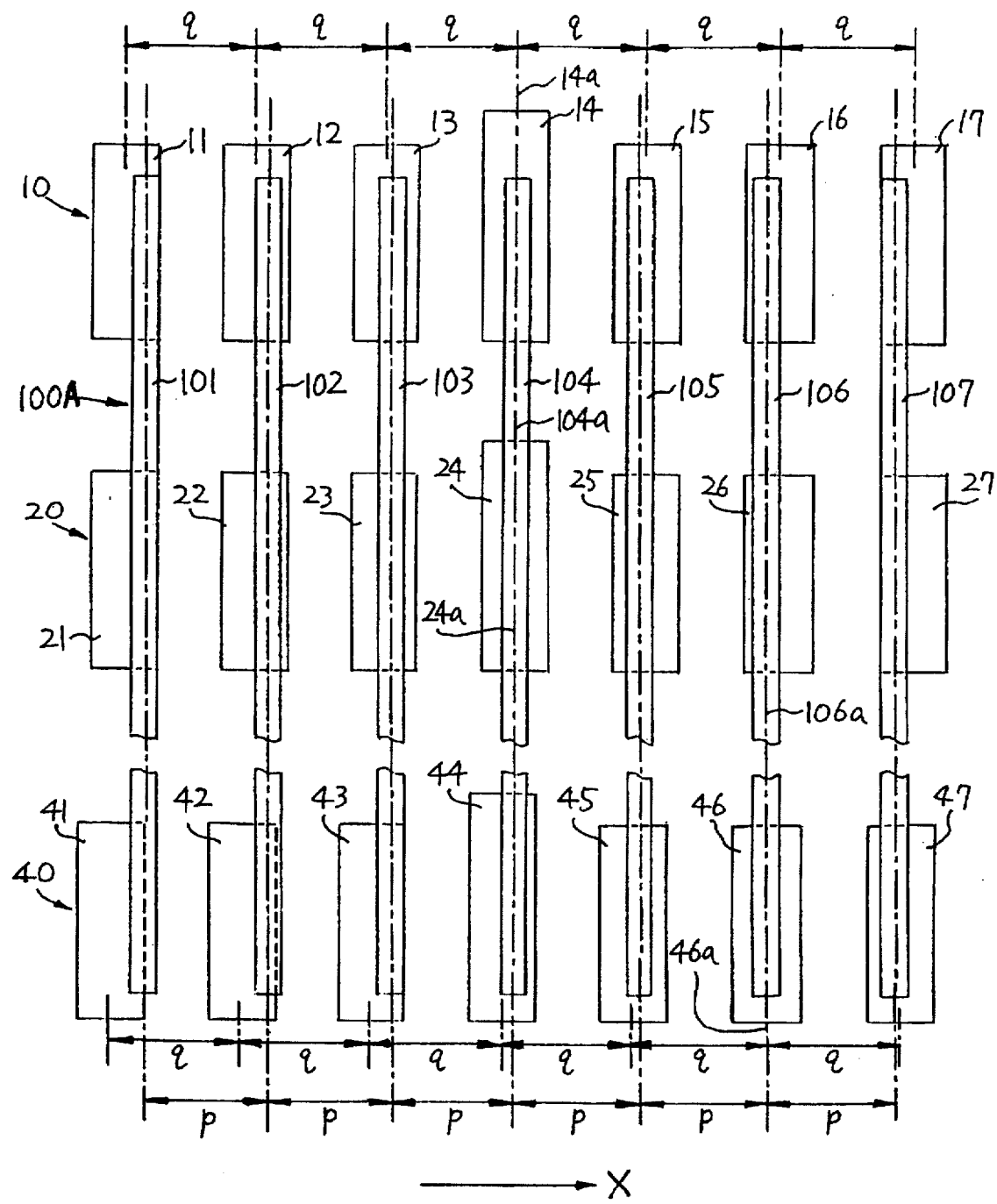
FIG. 3 shows the composite layout of another set of alignment check patterns according to the invention.

In FIG. 3, it is assumed that four alignment check patterns 10, 20, . . . 40 are respectively provided to four patterns of circuit componens defined on the wafer in four separate photolithographic steps. Each of these check patterns 10–40 is a row of rectangular pattern elements (e.g., 41, 42, . . . 47) and is analogous to the check patterns 10, 20 in FIG. 1. In any of these check patterns 10–40 the rectangular pattern elements are arranged at a constant pitch q. The check patterns 10–40 are slightly spaced from each other (or may partly operlap each other), and the rectangular elements of each check pattern are longitudinally in alignment with the rectangular elements of the adjacent chek pattern(s), respectively.

On the photomask there is an alignment check pattern 100A consisting of seven rectangular pattern elements 101–107 arranged in a row at a constant pitch p smaller than the pitch q (q–p=t). This alignment check pattern 100A is substantially similar to the overlying check pattern 100 in FIG. 1, but in the check pattern 100A the rectangular elements 101–107 are elongated to comply with the incrase in the number of underlying check patterns. In the composite layout, each of the elements 101–107 of the overlying check pattern 100A partly overlaps a rectangular element of each of the underlying check patterns 20–40. Naturally, the overlap occurs over the entire lengths of the rectangular elements of the intermediately located check patterns (e.g., pattern 20).

In the case illustrated in FIG. 3, alignment accuracy is checked in the manner as described with reference to FIGS. 2(A) and 2(B). In FIG. 3 the center pattern element 104 of the overlying check pattern 100A accurately overlaps the center element 14 of the underlying first check pattern 10 and the center element 24 of the underlying second check pattern 20. So, the photomask pattern is accurately aligned (in the direction X) with the two patterns including the check patterns 10 and 20, respectively. However, the center element 104 does not accurately overlap the center element 44 of the underlying check pattern 40. Instead, the center axis 108a of the element 108 of the check pattern 100A is on the center axis 46a of the element 46 of the check pattern 40. That is, in the direction X the pattern including the check pattern 40 is misaligned with the two patterns respectively including the check patterns 10 and 20 by the distance 2t, and consequently the photomask pattern is misaligned with the pattern including the check pattern 40 by the distance 2t.

What is claimed is:

1. A method of checking the accuracy of alignment of a photomask pattern for a photolithographic step in fabricating semiconductor integrated circuits with a plurality of patterns which are individually defined on a wafer in a plurality of previous photolithographic steps, the method comprising:

(a) providing each of said plurality of patterns with an alignment check pattern consisting of a plurality of pattern elements arranged in a row at a first constant pitch such that the rows of pattern elements of the respective alignment check patterns become parallel to each other and such that each pattern element of each alignment check pattern is in alignment with a pattern element of each of the other alignment check pattern(s);

(b) providing the photomask pattern with another alignment check pattern consisting of a plurality of pattern elements arranged in a row at a second constant pitch different from said first constant pitch, said another alignment check pattern being arranged such that, in the composite layout of the alignment check patterns on the wafer and said another alignment check pattern, each pattern element of said another alignment check pattern partly overlaps a pattern element of each of the alignment check patterns on the wafer; and (c) examining which of the pattern elements of said another alignment check pattern is in accurate alignment with one of the pattern elements of each of the alignment check patterns on the wafer.

2. A method according to claim 1, wherein the pattern elements of the alignment check patterns on the wafer and the pattern elements of said another alignment check pattern are rectangular elements.

3. A method of checking the accuracy of alignment of a photomask pattern for a photolithographic step in fabricating semiconductor integrated circuits with a plurality of patterns which are individually defined on a wafer in a plurality of previous photolithographic steps, the method comprising:

(a) providing each of said plurality of patterns with an alignment check pattern consisting of a plurality of rectangular pattern elements arranged in a row with longitudinal axes of the respective pattern elements parallel to each other at a first constant pitch such that the rows of pattern elements of the respective alignment check patterns become parallel to each other and such that each pattern element of each alignment check pattern is longitudinally in alignment with a pattern element of each of the other alignment check pattern(s);

(b) providing the photomask pattern with another alignment check pattern consisting of a plurality of rectangular pattern elements arranged in a row with longitudinal axes of the respective pattern elements parallel to each other at a second constant pitch different from said first constant pitch, said another alignment check pattern being arranged such that, in the composite layout of the alignment check patterns on the wafer and said another alignment check pattern, the longitudinal axes of the rectangular pattern elements of said another alignment check pattern are parallel to the longitudinal axes of the rectangular pattern elements of the alignment check patterns on the wafer and such that each pattern element of said another alignment check pattern partly overlaps a pattern element of each of the alignment check patterns on the wafer; and (c) examining which of the pattern elements of said another alignment check pattern is in accurate alignment with a pattern element of each of the alignment check patterns on the wafer.

4. A method according to claim 3, wherein said second constant pitch is smaller than said first constant pitch.

5. A method according to claim 3, wherein the rectangular pattern elements of said another alignment check patter are narrower in width than the rectangular pattern elements of the alignment check patterns on the wafer.

6. A method according to claim 3, wherein at least one of the alignment check patterns on the wafer partly overlaps at least one other of the alignment check patterns on the wafer.

* * * * *